United States Patent [19]

Mader

[11] 4,240,094

[45] Dec. 16, 1980

[54] LASER-CONFIGURED LOGIC ARRAY

[75] Inventor: Jim M. Mader, Indialantic, Fla.

[73] Assignee: Harris Corporation, Cleveland, Ohio

[21] Appl. No.: 887,968

[22] Filed: Mar. 20, 1978

[51] Int. Cl.³ .................. H01L 21/88; H01L 29/52; H01L 27/10
[52] U.S. Cl. ........................ 357/45; 29/584; 29/577 C; 219/121 LD; 219/121 LM; 357/40; 357/59; 357/68; 357/71; 357/42; 307/207
[58] Field of Search ............ 357/40, 45, 41, 68, 357/71, 59; 307/207, 213, 303; 219/121 L, 121 LC, 121 LD, 121 LE, 121 LF, 121 LG, 121 LH, 121 LJ, 121 LM, 121 EJ, 121 EK; 29/575, 577 R, 577 IC, 584

[56] References Cited

U.S. PATENT DOCUMENTS

| 3,365,707 | 1/1968 | Mayhew ............................. 357/41 |
| 3,584,183 | 6/1971 | Chiaretta et al. ...................... 357/45 |
| 3,621,562 | 11/1971 | Patel .................................. 357/40 |
| 3,634,927 | 1/1972 | Neale et al. ......................... 357/40 |
| 4,032,894 | 6/1977 | Williams ............................. 307/207 |
| 4,172,741 | 10/1979 | Johnson ............................ 357/91 |

OTHER PUBLICATIONS

Kuhn et al., IEEE J. of Solid-State Circuits, vol. SC-10, No. 4, Aug. 1975, pp. 219-228.

Primary Examiner—William D. Larkins
Attorney, Agent, or Firm—Craig & Antonelli

[57] ABSTRACT

An LSI fabrication process employs pulsed laser energy to selectively tailor individual logic elements of which the building blocks of an LSI array may be configured and to selectively interconnect these laser-configured building blocks. On an LSI chip, an array of universal logic devices or building blocks may be formed together with a matrix pattern of intrablock pathways or signal channels through which the building blocks may be tested and selectively interconnected in order that a prescribed LSI configured system or subsystem may be formed. By selectively directing pulsed laser energy onto prescribed connection regions of the building blocks and onto selected regions of the intrablock pathways, thereby interconnecting and/or disconnecting portions of a conductor matrix pattern relative to the structural components of the various cells, there is obtained a prescribed LSI containing both laser-configured logic devices (building blocks) and laser-configured highways interconnecting the selectively tailored logic devices.

37 Claims, 6 Drawing Figures

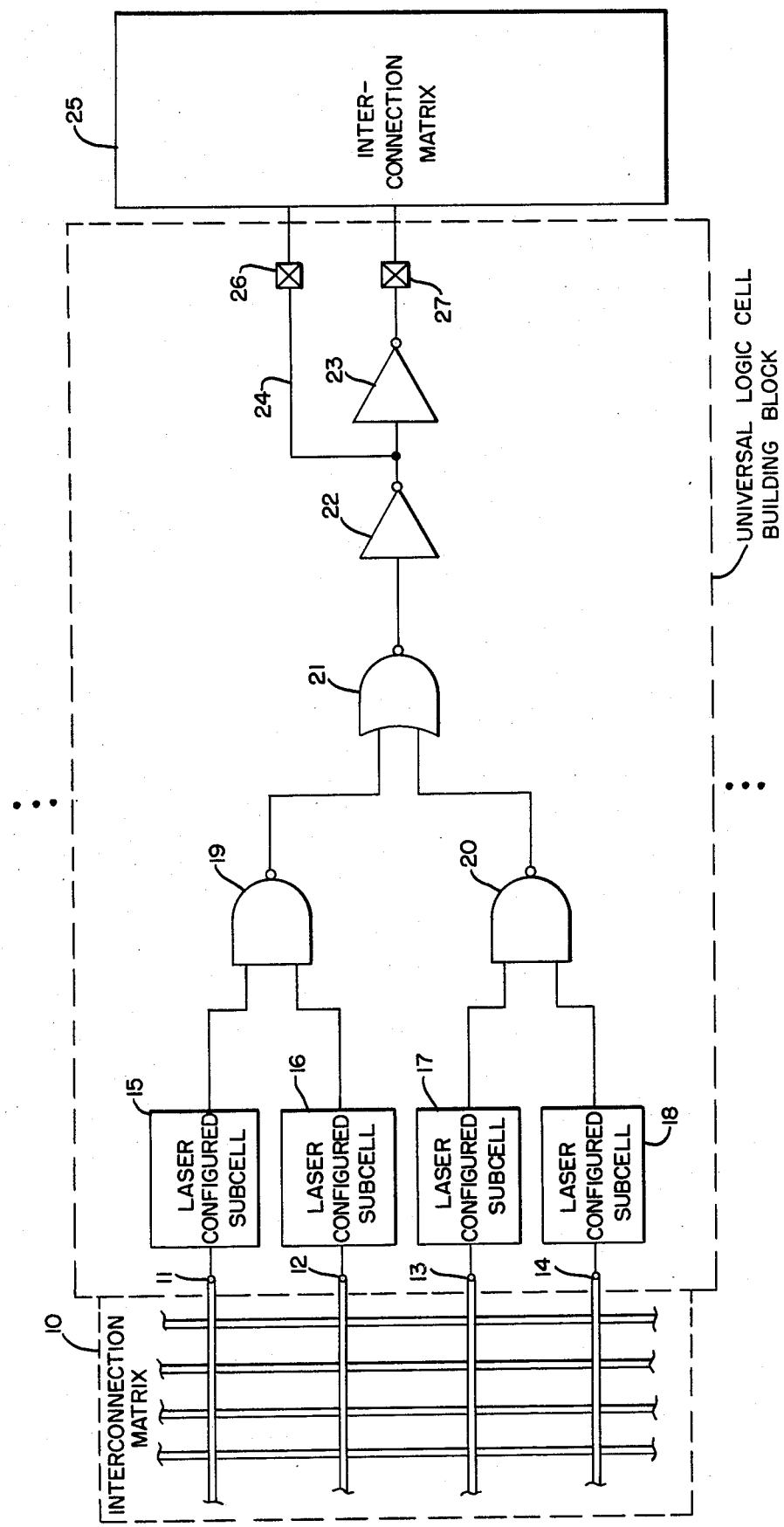

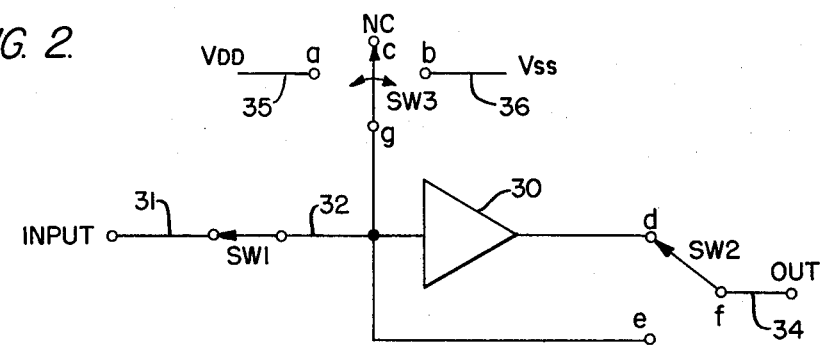
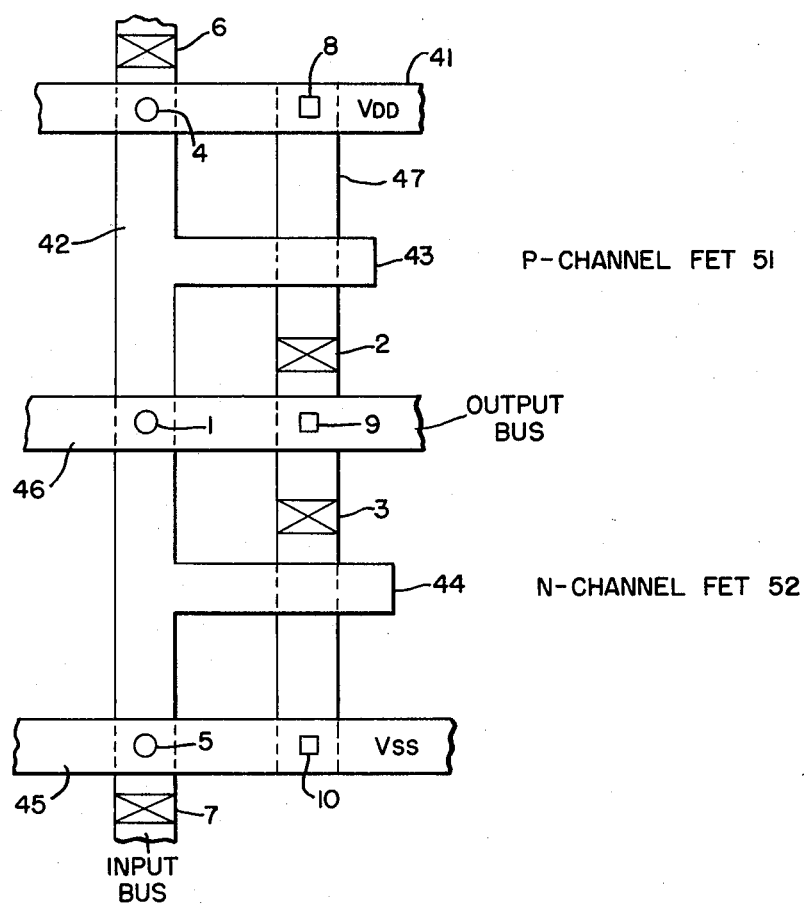
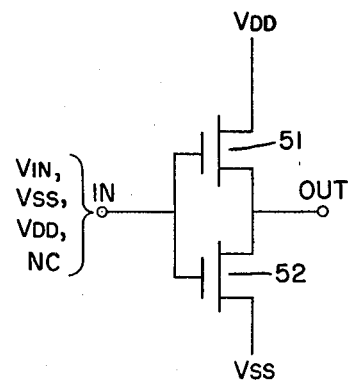

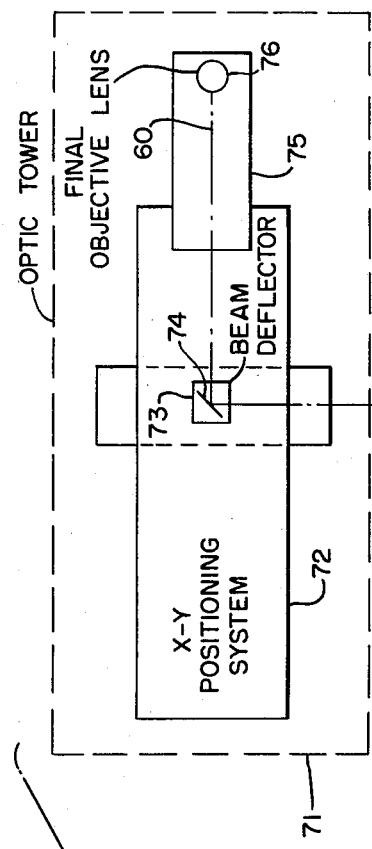
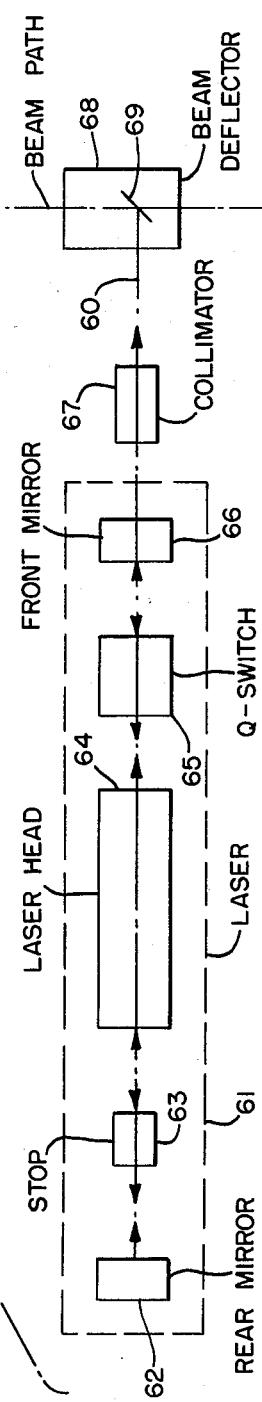
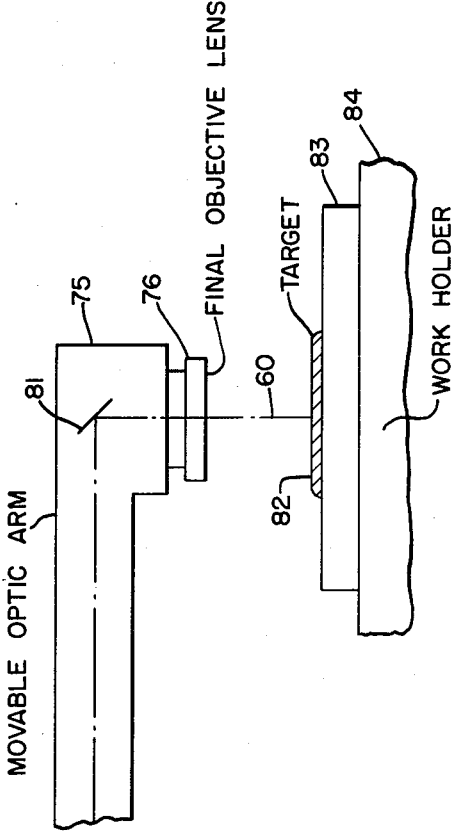
FIG. 5.
FIG. 6.

LASER-CONFIGURED LOGIC ARRAY

FIELD OF THE INVENTION

The present invention relates to a technique for forming a large-scale integrated circuit (LSI), and is particularly directed to a process of selectively tailoring a plurality of elementary logic cells or building blocks of which the LSI is to be comprised and selectively interconnecting the logic cells through the use of a laser.

BACKGROUND OF THE INVENTION

Concomitant with the development of electronic apparatus at the system and subsystem level has been the growth and refinement of large-scale integrated circuit (LSI) technology. Through this technology improved semiconductor manufacturing techniques have permitted the fabrication of more and more circuit components in or on the same semiconductor chip or substrate, whereby the electronic functional complexity of the chip approaches a system or subsystem level, as distinguished from more basic functional electronic circuits, such as logic gates, amplifiers, etc.

A particularly beneficial application of LSI technology has been in the area of digital systems, e.g. computers, and through which the microprocessor industry was born. A typical LSI system or subsystem may comprise a plurality of circuit components, such as various logic elements, including gates, flip-flops, etc., integrated together on a single chip, by manufacturing processes including photo-fabrication, silicon processing, wafer testing, and packaging. Within the overall integrated circuit, a plurality of interconnection highways or signal transmission paths are provided for interconnecting the individual circuit elements to one another, and thereby obtain some prescribed electronic system or subsystem. Thus, the LSI-fabricated electronic system may be considered as being comprised essentially of two components—i) the individual circuit elements and (ii) the interconnection paths between the circuit elements.

In an effort to achieve efficient functional design and to increase packaging density various fabrication design approaches have been used. One approach which permits a more general application of an array of chip components to a plurality of specific needs involves the organization of a plurality of substantially identical circuit components, that may be termed standard cells or unit building blocks, which may have either a fixed or variable functional identity, so that the system designer can tailor a chip to a particular application by suitably designing a scheme for interconnecting the necessary building blocks available in the array.

Unfortunately, even with improvements in semiconductor manufacturing techniques and new semiconductor device structure (e.g. CMOS, SOS, etc.,) a major portion of an LSI chip may be occupied by the interconnection highways (e.g. diffusions, semiconductor overlays, metallizations); it is not uncommon for a typical LSI array to allow only fifteen to twenty percent of chip area for the cells themselves. Therefore, proper design and tailoring of the cells and system interconnection design are critical areas of chip design. This becomes especially important when considering that the time and expense required to complete the manufacture of an LSI system may be undesirably increased if defects occur during cell integration processing, resulting in the need to begin the manufacturing process anew.

Recent developments in integrated circuit fabrication techniques have produced a connection formation scheme through which a laser may be used to selectively interconnect signal pathways (e.g. aluminum metallizations) between blocks. An example of such a proposed scheme has been reported by P. W. Cook et al, in IBM Technical Disclosure Bulletin Vol. 17, No. 1, June 1974. In accordance with this reported fabrication technique, redundant blocks are connected to an interconnection highway comprised of signal and test tracks by directing pulsed laser light onto a metallization layer of aluminum, for example, in order to join the aluminum to underlying interconnection tracks diffused in the surface of a substrate. The diffused interconnection highways extend from the area of the aluminum metallization to clusters of redundant logic blocks or chips, each of which is identical to the others. Prior to interconnecting the blocks to the metallizations, the blocks may be tested by a separate testing highway path.

Another discussion of the use of pulsed laser energy to interconnect an aluminum metallization layer to an underlying diffused semiconductor region may be found in Vol. SC-10, No. 4, August 1975 of the Journal of Solid State Circuits, in an article by L. Kuhn et al, entitled "Experimental Study of Laser Formed Connections for LSI Water Personalization".

Now, although the above-described use of lasers to selectively join redundant blocks to interconnection highways may offer improved integration and a possible reduction in the number of package levels required for a complete LSI module, it does not take full advantage of the beneficial aspects of the unit cell approach to logic design and the manner in which it may be implemented by laser modification techniques, so as to permit a considerable savings in both the processing scheduling and expense involved in conventional LSI fabrication techniques.

SUMMARY OF THE INVENTION

In accordance with the present invention, there is provided an improved LSI fabrication process which employs laser technology to selectively tailor individual logic elements of which the building blocks of an LSI array may be configured and to selectively interconnect these laser-configured building blocks. On the chip, an array of universal logic devices or building blocks may be formed together with a matrix pattern of intrablock pathways or signal channels through which the building blocks may be tested and selectively interconnected in order that a prescribed LSI configured system or subsystem may be formed. By selectively directing pulsed laser energy onto prescribed connection regions of the building blocks and onto selected regions of the intrablock pathways, thereby interconnecting and/or disconnecting portions of a conductor matrix pattern relative to the structural components of the various cells, there is obtained a prescribed LSI containing both laser-configured logic devices (building blocks) and laser-configured highways interconnecting the selectively tailored logic devices. Such an LSI can be fabricated in a period of time considerably reduced relative to one produced according to prior art manufacturing techniques. Individual unit cells from which the LSI building blocks are to be formed may be fully tested and packaged prior to LSI logic design and, except for sealing and final electrical testing, all time consuming functions may be completed prior to the laser-configured fabrication process. Advantageously, only a very small number, e.g. two or three and, with appropriate circuit design only one type, of unit cell logic array need be manufactured, irrespective of the eventual logic design to be employed.

BRIEF DESCRIPTION OF THE DRAWINGS

FIG. 1 is a block diagram of the constituents of an individual logic cell building block within an array and associated interconnectable signal pathways of a conductor matrix of an LSI chip;

FIG. 2 is a schematic diagram of the circuitry components of which a laser-configured subcell may be comprised;

FIG. 3 is a topological illustration of semiconductor and signal pathway components of a laser-configured subcell;

FIG. 4 is a circuit diagram of an inverter; and

FIGS. 5 and 6 are block diagrams of an optical system usable for laser-configuring an LSI chip.

DETAILED DESCRIPTION

FIG. 1 illustrates an exemplary configuration of a logic device or building block which may be selectively tailored and combined with other building blocks to form a large-scale integrated circuit in accordance with the present invention. Each building block may be comprised of a number of discrete logic elements (e.g. NAND gate, NOR gate, inverter, etc.) interconnected together in accordance with a general application digital circuit design, so that, in effect, any Boolean transfer function for a preselected number of inputs may be implemented using the logic elements provided, simply by tailoring prescribed ones of the logic elements in accordance with a particular given Boolean transfer function. It is to be understood that the application of the present invention is not strictly limited to the building block configuration shown in FIG. 1 but is applicable to other functional block designs and semiconductor configurations to be combined into an integrated circuit. The exemplary configuration shown in FIG. 1 is presented to illustrate one embodiment of a unit cell approach to LSI design and the manner in which the transfer function of a building block may be laser-tailored or laser-configured to meet the functional logic circuit requirements of the LSI components.

In the general Boolean application circuit design shown in FIG. 1, each building block may comprise a plurality (e.g. four) of input terminals 11 through 14 and a pair of output terminals 26 and 27. Input terminals 11 through 14 may be selectively coupled to an interconnection highway 10 over which signals for other building blocks may be derived, and output terminals 26 and 27 may be selectively coupled to an interconnection highway 25 to supply appropriate signals representative of the logic operation carried out by the building block on input signals applied thereto. The interconnection highways may comprise a plurality of signal channel tracks, such as diffussion tracks formed in the substrate, metallization layers or conductive semiconductor layers insulated from and overlying the surface of the substrate, etc., arranged in a matrix configuration on the chip, and among the rows and columns of multiple tracks of which the building blocks of an array are disposed. At appropriate regions, the signal channel tracks may relatively overlap while being insulated from each other so that selective interconnections between the interconnective highways may be effected by suitably laser-connecting signal track cross points, for example. Alternatively, or in addition, signal tracks may originally be connected with one another at interconnection highway cross points and selectively severed by directing pulsed laser energy thereon. It is through these interconnection highways or intrablock signal channels that the various building blocks or logic devices of which the LSI is to be comprised may be connected together and thereby perform all the logical operations for which the LSI system or subsystem has been designed.

Connected to input terminals 11 through 14 are respective laser-configured logic elements (or subcells) 15 through 18, the details of which will be described below with reference to FIGS. 2 and 3. For purposes of description of FIG. 1, each laser-configured subcell 15 may be selectively laser-tailored to function as an inverter, as a direct connection between the input and output of the subcell, or as a logic element which provides a preselected logic level, i.e. a "0" or a "1" respectively represented by fixed voltages.

Prior to the laser-configuration operation, the configuration of each subcell resulting from appropriate semiconductor processing steps may be the same. However, the final configuration that each laser-configured subcell will assume is determined in accordance with the intended logic operation to be carried out by the particular logic block containing that subcell and, in accordance with the present invention, is to be implemented by the use of pulsed laser energy, to thereby selectively configure the subcells 15 through 18 into one of the above-described configurations and thereby tailor the logic block containing subcells 15 through 18 to perform a prescribed Boolean operation.

In the general Boolean application logic design shown in FIG. 1, the outputs of laser-configured subcells 15 and 16 may be connected to the inputs of NAND gate 19, while the outputs of laser-configured circuits 17 and 18 may be connected to the input of NAND gate 20. The outputs of NAND gates 19 and 20, in turn, may be connected to the inputs of NOR gate 21, the output of which may be connected to an inverter driver 22. The output of inverter driver 22 may be connected to a first output line 24 and to another inverter driver 23. Output line 24 and the output of inverter driver 23 may be connected to selectively removeable output terminals 26 and 27, at which a Boolean function representative output O and its complement $\overline{O}$ may be selectively derived.

For the above-described logical configuration, by selectively laser-tailoring subcells 15 through 18 to define one of their available transfer functions, a building block shown in FIG. 1 may carry out any Boolean combinational operation for from one to four input variables. Therefore, by selectively laser-tailoring a plurality of such building blocks and laser-interconnecting the tailored blocks via the interconnection highways provided on the chip, implementation of an LSI, the operation of which may entail the need for multiplicity of diverse logic operations, is achieved.

FIG. 2 illustrates, in schematic form, the constituents of an individual one of the subcells 15 that may be laser-tailored to carry out one of a plurality of specific logic transfer functions. As a result of semiconductor processing, each subcell may originally be configured as an inverter. For this purpose, each subcell may have an input terminal INPUT which may be connected via a lead 31 to one side of a normally closed switch SW₁. The other side of switch SW₁ may be connected via lead 32 to the input of an inverter 30 and to terminal e of switch SW₂. Terminal d of switch SW₂ may be connected via lead 33 to the output of the inverter 30, while terminal f of switch SW₂ may be connected via lead 34 to the output OUT of the subcell. In the pre-laser-configured condition of the subcell, terminals d and f of switch SW₂ may be connected together while terminals e and f are unconnected. Lead 32 may be further connected to terminal g of switch SW₃. In the pre-laser-configured condition, terminal g of switch SW₃ may be connected to an open terminal c. An additional terminal a of switch SW₃ may be connected via lead 35 to a first source of bias potential (e.g. a drain bias voltage $V_{DD}$), and an additional terminal b of switch SW₃ may be connected via a lead 36 to a second source of bias potential (e.g. a source bias voltage $V_{SS}$).

A plan view of the chip configuration of an individual laser-configured subcell, schematically illustrated in FIG. 2, is depicted in FIG. 3. While only a single subcell is shown, it will be understood that since an LSI chip may comprise an array of building blocks, each of which may include a number of laser-configured subcells, such as subcells 15 through 18, shown in FIG. 1, then, on an LSI chip there will be formed a multiplicity of the subcells which may be configured as shown in FIG. 3.

The inverter portion, corresponding to inverter 30 in FIG. 2, of each subcell, may comprise a pair of opposite channel type field effect transistors 51 and 52 connected in series between respective sources of reference potential $V_{DD}$ and $V_{SS}$, as shown in FIG. 4. The gates of the transistors may be connected in common to the inverter input, and the source-drain series connection of transistors 51 and 52 connected to the inverter output. Of course, other inverter configurations may be employed, the invention not being limited to the particular driver-load FET configuration shown in FIG. 4. For illustrative purposes, driver FET 52 may comprise an N-channel FET while load FET 51 may comprise a P-channel device.

Referring again to FIG. 3, each transistor may be formed in a silicon layer 47 disposed on the surface of a semiconductor wafer. Silicon layer 47 may be suitably doped with the necessary impurities to provide source and drain regions for P-channel FET 51 and N-channel FET 52 in a manner well known in the art. The bias potentials $V_{DD}$ and $V_{SS}$ may be supplied via voltage buses 41 and 45, connected via contact 8 to the drain region of FET 51 and via contact 10 to the source region of FET 52, respectively. The respective gate electrodes of FETs 51 and 52 are formed by extensions 43 and 44 of a polysilicon bus 42 extending over an insulating film (not shown) and the surface of the substrate and over silicon layer 47. Bus 42 corresponds to lead 32 of the schematic circuit illustration of FIG. 2 and may be formed as an integral bus highway for a plurality of circuits, to increase the cell density. As will be described below, bus 42 may be selectively severed or broken at areas 6 and/or 7 if the circuit is not to be responsive to input signals. Polysilicon bus 42 may be selectively connectable to drain supply bus 41 at a contactable region 4, to output bus 46 at contactable region 1, and to source supply bus 45 at contactable region 5. Output bus 46, like drain and source supply buses 41 and 45, may comprise a suitable metallization layer and may overly an insulating film atop the wafer, polysilicon bus 42, and silicon layer 47. Output bus 46 is connected to silicon layer 47 at contact region 9, and, as described above, may be connected to polysilicon highway 42 at contactable region 11. Regions 2 and 3 of silicon layer 47, on opposite sides of output bus 46, identify regions where silicon layer 47 may be selectively severed to separate the output bus 46 from the inverter FETs 51 and 52.

As was mentioned previously, each subcell, which is originally configured schematically as shown in FIG. 2 and topologically as shown in FIG. 3, may be selectively laser-tailored into one of a plurality of functional logic elements, as will be explained in detail below.

I—INPUT USED (INVERTED)

As has been described previously and as is illustrated in FIGS. 2 and 3, in its originally manufactured form, each subcell operates as an inverter for an input signal applied to the input terminal INPUT so that the complement of the logic level applied to the subcell will appear at the subcell output terminal OUT. Therefore, any of the subcells of which a building block is comprised, to be employed as an inverter, requires no alteration of its original configuration, i.e. no laser-configuring.

II—INPUT USED (NON-INVERTED)

In the instances where the building block requires a direct, non-inverted connection from an input terminal to an input of one of NAND gates 19 and 20, the subcell which is disposed therebetween is laser-tailored to convert the subcell from its normal inverter configuration to a non-inverting direct-coupling configuration. For this purpose, the connection between terminals d and f of switch SW₂ is severed and terminals e and f are connected together. To achieve this necessary modification, pulsed laser energy is controllably directed at contactable region 1 of metallization bus 46 to cause an ohmic connection to be made through an opening produced in the insulating film between polysilicon layer 42 and bus 46 as a result of the laser pulses. Laser pulses are also directed at separation regions 2 and 3 in silicon layer 47 to thereby separate output bus 46 from each of FETs 51 and 52. As a result of the selective application of pulsed laser energy to the three regions 1, 2, and 3, a signal applied to input bus 42 will be directly connected to output bus 46, with the action of inverter 30 being removed from the subcell output.

III—INPUT NOT USED

If any of the inputs $I_1$ through $I_4$ of a building block is not to be used, it may be strapped to an appropriate logic level to either inhibit or enable the appropriate NAND gate to which the input is coupled via the subcell. For this purpose, pulsed laser energy is directed to one of contact regions 4 or 5 to thereby effectively strap the subcell input to $V_{DD}$ or $V_{SS}$ and selectively render FETs 51 and 52 alternately conductive or non-conductive, and thereby provide the necessary logic level ("1" or "0") representative voltage on output bus 46.

In addition, pulsed laser energy may be directed at separation regions 6 and 7 in order to isolate the subcell for which an input is not used from the other subcells in the array.

An exemplary positioning system by way of which pulsed laser energy may be controllably directed upon an integrated circuit building block array and the interconnection highways associated therewith is shown in FIGS. 5 and 6. The laser 61, proper, may include a suitable laser head 64 having a controllable power source (not shown) and a pair of cavity mirrors 62 and 66 located at opposite ends of the laser 61. A suitable aperture stop element 63 may be provided between rear mirror 62 and laser head 63 for defining the cross-sectional area of the beam emitted by the laser 61. A suitable electrically operated Q-switch 65 is optically coupled between laser head 64 and front mirror 66 for controlling the duration and repetition rate of the pulses emitted by laser 61. The pulses of laser energy emitted by laser 61 are focused by collimation optics 67 as they travel along beam path 60. Beam deflecting optics 68 and 73, which may include appropriate mirrors 69 and 74, direct the collimated pulses through an X-Y movable optics arm 75, off a reflecting mirror 81 to a final objective lens 76. Mirror 69 may be partially reflective, partially transmissive to permit observation of the regions of the target upon which the pulsed laser energy is directed. A suitable viewing camera (not shown) may be employed for this purpose. Lens 76 focusses the pulsed laser beam onto a preselected target region of a layer 82 of chip 83 (e.g. onto one of the regions 1 through 7, shown in FIG. 3, or an interconnection highway cross point), to cause either an interconnection or disconnection of the appropriate building block component or matrix layer to occur. Chip 83 may be supported in a conventional manner on an appropriate work holder which permits the necessary X-Y positioning of the chip 83 relative to beam axis 60.

The parameters of the pulsed laser beam (power, number of pulses, pulse duration, repetition rate) are chosen in dependence upon the material used on the chip to effectively produce the required interconnection of an overlying metallization to an underlying diffused region, or to sever a layer region, such as regions 2 and 3 of silicon layer 47, as explained previously. The X-Y positioning system may be operator or computer controlled to position the laser optic arm over a selected target area, so that the control of laser 61 will cause the appropriate number of laser pulses to be directed to the regions of interest on the chip to alter the connections. Computer control of the system is especially advantageous since it permits programmed control of laser operation in accordance with the finallized topological location of all laser-tailored connections, whether they be effected in the subcells themselves or at other locations in the building blocks or interconnection highways. For example, and referring again to FIG. 1, output terminal connections 26 and 27 illustrate regions where laser-configured interconnections may be selectively made or severed (depending upon the originally processed chip structure) and thereby selectively join the appropriate number of building blocks to the interconnection highways.

As will be appreciated from the foregoing description of the invention, the universal cell approach to manufacturing a large-scale integrated circuit may be substantially improved by employing laser fabrication techniques both to selectively tailor or configure the constituted cells of which an LSI is to be formed and to selectively interconnect the cells to be used as part of the LSI. Because laser-configuration processing may be carried out after the initial semiconductor device processing, the building blocks and interconnection pathway matrices of the chips may be tested prior to implementing the final LSI layout. Not only does this permit a reduction in LSI processing time but it permits a dramatic increase in the quantity of usable chips per wafer. To the extent that LCLA chips design permits 100% defect isolation, all processed silicon can be used for fabrication of LSI chips.

While I have shown and described one embodiment in accordance with the present invention, it is understood that the same is not limited thereto but is suceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A process for forming an integrated circuit comprising the steps of:
   (a) providing a semiconductor substrate which contains a plurality of logic cells from which the integrated circuit is to be formed, each logic cell containing a plurality of semiconductor elements together with intracell semiconductor and metallization connection paths to be selectively interconnected with one another to define a prescribed functional cell, and interconnection pathways by way of which prescribed ones of said logic cells may be connected together;
   (b) selectively directing electromagnetic energy at prescribed portions of selected ones of said logic cells so as to disconnect selected portions of said semiconductor connection paths and to interconnect selected portions of said metallization connection paths to selected semiconductor material of said cells, thereby changing the transfer function originally defined by said selected ones of said logic cells; and
   (c) selectively interconnecting logic cells among said plurality including said selected ones of said logic cells, to thereby produce an integrated circuit composed of a plurality of interconnected logic cells, the transfer functions of selected ones of which have been electromagnetically altered.

2. A process according to claim 1, wherein at least some of said logic cells include a plurality of subcells interconnected together to form a respective logic cell, and wherein step (b) comprises the step of selectively directing said electromagnetic energy at prescribed subcells among those contained in said selected ones of said logic cells.

3. A process according to claim 1, wherein each of the subcells at which electromagnetic energy is to be selectively directed in step (b) is structurally identical prior to step (b).

4. A process according to claim 1, wherein said electromagnetic energy comprises optical energy.

5. A process according to claim 4, wherein said optical energy is in the form of pulsed optical energy.

6. A process according to claim 2, wherein step (b) comprises the step of selectively directing electromagnetic energy at preselected portions of said prescribed subcells, thereby causing the interconnection of circuit components of which said prescribed subcells have been formed.

7. A process according to claim 2, wherein step (b) comprises the step of selectively directing electromagnetic energy at preselected portions of said prescribed subcells, thereby causing the disconnection of circuit components of which said prescribed subcells have been formed.

8. A process according to claim 2, wherein step (b) comprises the steps of
    selectively directing electromagnetic energy at first preselected portions of said prescribed subcells, thereby causing the interconnection of circuit components of which said prescribed subcells have been formed, and
    selectively directing electromagnetic energy at second preselected portions of said prescribed subcells, thereby causing the disconnection of circuit components of which said prescribed subcells have been formed.

9. A process according to claim 2, wherein each of said subcells comprises:
    an input signal pathway,
    an output signal pathway, and
    an active circuit element having an input coupled to said input signal pathway and an output coupled to said output signal pathway.

10. A process according to claim 1, wherein step (b) comprises the step of selectively directing a pulsed laser beam at prescribed portions of selected ones of said logic cells, thereby changing the transfer function originally defined by said selected ones of said logic cells.

11. A process according to claim 1, wherein step (c) comprises the step of selectively directing electromagnetic energy at said interconnection pathways, thereby selectively interconnecting logic cells among said plurality of logic cells including said selected ones of said logic cells, to thereby produce an integrated circuit composed of a plurality of electromagnetically interconnected logic cells the transfer functions of selected ones of which have been electromagnetically altered.

12. A process according to claim 11, wherein the electromagnetic energy selectively directed in accordance with steps (b) and (c) is in the form of a pulsed laser beam.

13. A process according to claim 2, wherein step (c) comprises the step of selectively-directing electromagnetic energy at said interconnection pathways, thereby selectively interconnecting logic cells among said plurality of logic cells including said selected ones of said logic cells, to thereby produce an integrated circuit composed of a plurality of electromagnetically interconnected logic cells the transfer functions of selected ones of which have been electromagnetically altered.

14. A process according to claim 13, wherein the electromagnetic energy selectively directed in accordance with steps (b) and (c) is in the form of a pulsed laser beam.

15. A process according to claim 1, wherein step (c) comprises the step of selectively directing electromagnetic energy at said interconnection pathways, thereby selectively disconnecting logic cells among said plurality of logic cells, except for said selected ones of said logic cells, to thereby produce an integrated circuit composed of a plurality of electromagnetically interconnected logic cells the transfer functions of selected ones of which have been electromagnetically altered.

16. A process according to claim 15, wherein the electromagnetic energy selectively directed in accordance with steps (b) and (c) is in the form of a pulsed laser beam.

17. A process according to claim 1, wherein said semiconductor elements and said intracell semiconductor connection paths are formed of layers of semiconductor material disposed upon said semiconductor substrate.

18. A process for forming a logic circuit device comprising the steps of:
    (a) providing a semiconductor substrate which contains a plurality of logic elements from which a logic circuit device is to be formed, each logic element containing a plurality of semiconductor elements together with intraelement semiconductor and metallization connection paths to be selectively interconnected with one another to define a prescribed function logic element, and interconnection pathways by way of which said logic elements are connected together to thereby provide any one of a plurality of diverse logic operations; and
    (b) selectively directing electromagnetic energy at prescribed portions of selected ones of said logic elements so as to disconnect selected portions of said semiconductor connection paths and to interconnect selected portions of said metallization connection paths to selected semiconductor material of said logic elements, thereby changing the transfer function originally defined by said selected ones of said logic elements and causing said logic circuit device to provide one of said plurality of logic operations.

19. A process according to claim 18, wherein each of the logic elements at which electromagnetic energy is to be selectively directed in step (b) is structurally identical prior to step (b).

20. A process according to claim 19, wherein said electromagnetic energy comprises optical energy.

21. A process according to claim 20, wherein said optical energy is in the form of a pulsed laser beam.

22. A process according to claim 18, wherein each of said selected logic elements comprises:
    an input signal pathway,
    an output signal pathway, and
    an active circuit element having an input coupled to said input signal pathway and an output coupled to said output signal pathway.

23. A process according to claim 18, wherein said semiconductor elements and said intracell semiconductor connection paths are formed of layers of semiconductor material disposed upon said semiconductor substrate.

24. An integrated circuit comprising:
    a semiconductor substrate which contains a plurality of logic cells from which the integrated circuit is formed, each logic cell containing a plurality of semiconductor elements together with intracell semiconductor and metallization connection paths, and interconnection pathways by way of which prescribed ones of said logic cells are connected together,
    prescribed portions of selected ones of said logic cells having been altered by the impingement of electromagnetic energy thereon with selected portions of said semiconductor connection paths having been disconnected and selected portions of said metallization connection paths having been interconnected to selected semiconductor material of said cells to define the transfer function of said selected ones of said logic cells, and
    selected ones of said interconnection pathways having been interconnected to thereby selectively interconnect logic cells among said plurality, including said selected ones of said logic cells.

25. An integrated circuit according to claim 24, wherein at least some of said logic cells include a plurality of subcells interconnected together to form a respective logic cell, and wherein prescribed subcells among those contained in said selected ones of said logic cells have been altered by the impingement of electromagnetic energy thereon.

26. An integrated circuit according to claim 24, wherein said electromagnetic energy comprises optical energy.

27. An integrated circuit according to claim 26, wherein said optical energy is in the form of pulsed optical energy.

28. An integrated circuit according to claim 25, wherein preselected portions of said prescribed subcells have been irradiated with electromagnetic energy to cause the interconnection of circuit components of which said prescribed subcells are formed.

29. An integrated circuit according to claim 25, wherein preselected portions of said prescribed subcells have been irradiated with electromagnetic energy to cause the disconnection of circuit components of which said prescribed subcells are formed.

30. An integrated circuit according to claim 25, wherein first preselected portions of said prescribed subcells have been irradiated with electromagnetic energy to cause the interconnection of circuit components of which said prescribed subcells are formed, and second preselected portions of said prescribed subcells have been irradiated with electromagnetic energy to cause the disconnection of circuit components of which said prescribed subcells are formed.

31. An integrated circuit according to claim 25, wherein each of said subcells comprises:
an input signal pathway,
an output signal pathway, and
an active circuit element having an input coupled to said input signal pathway and an output coupled to said output signal pathway.

32. An integrated circuit according to claim 24, wherein said semiconductor elements and said intracell semiconductor connection paths are formed of layers of semiconductor material disposed upon said semiconductor substrate.

33. A logic circuit device comprising:
a semiconductor substrate which contains a plurality of logic elements from which the logic circuit device is formed, each logic element containing a plurality of semiconductor elements together with intraelement semiconductor and metallization connection paths, and interconnection pathways by way of which said logic elements are connected together, and prescribed portions of selected ones of said logic elements having been altered by the impingement of electromagnetic energy thereon with selected portions of said semiconductor connection paths having been disconnected and selected portions of said metallization connection paths having been interconnected to selected semiconductor material of said logic elements to define the transfer function of said selected ones of said logic elements to cause said logic circuit device to perform a specified logic operation.

34. A logic circuit device according to claim 33, wherein said electromagnetic energy comprises optical energy.

35. A logic circuit device according to claim 34, wherein said optical energy is pulsed laser energy.

36. A logic circuit device according to claim 33, wherein each of said selected logic elements comprises:
an input signal pathway,
an output signal pathway, and
an active circuit element having an input coupled to said input signal pathway and an output coupled to said output signal pathway.

37. A logic circuit device according to claim 33, wherein said semiconductor elements and said intracell semiconductor connection paths are formed of layers of semiconductor material disposed upon said semiconductor substrate.

* * * * *